United States Patent
Lee

(10) Patent No.: US 6,822,924 B2
(45) Date of Patent: Nov. 23, 2004

(54) SYNCHRONOUS SEMICONDUCTOR MEMORY DEVICE HAVING CLOCK SYNCHRONIZATION CIRCUIT AND CIRCUIT FOR CONTROLLING ON/OFF OF CLOCK TREE OF THE CLOCK SYNCHRONIZATION CIRCUIT

(75) Inventor: Ihl-Ho Lee, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/625,173

(22) Filed: Jul. 22, 2003

(65) Prior Publication Data

US 2004/0125640 A1 Jul. 1, 2004

(30) Foreign Application Priority Data

Oct. 30, 2002 (KR) ................................ 10-2002-0066427

(51) Int. Cl.[7] ................................................ G11C 8/00
(52) U.S. Cl. ........................ 365/233; 365/191; 365/193; 365/194
(58) Field of Search .................................. 365/191, 193, 365/194, 233

(56) References Cited

U.S. PATENT DOCUMENTS

| | | | | |
|---|---|---|---|---|
| 6,292,412 B1 | * | 9/2001 | Kato et al. | 365/194 |
| 6,438,060 B1 | | 8/2002 | Li et al. | |
| 6,456,563 B1 | * | 9/2002 | Kajimoto | 365/233 |
| 6,483,579 B2 | * | 11/2002 | Koshikawa | 356/233 |
| 6,628,553 B2 | * | 9/2003 | Feurle et al. | 365/189.05 |
| 2002/0110035 A1 | | 8/2002 | Li et al. | |
| 2002/0181299 A1 | | 12/2002 | Li et al. | |

* cited by examiner

Primary Examiner—Van Thu Nguyen
(74) Attorney, Agent, or Firm—Blakely Sokoloff Taylor & Zafman

(57) ABSTRACT

The present invention provides a semiconductor memory device for reducing power consumption by turning off a DLL clock tree in stand-by mode. The synchronous semiconductor memory device in accordance with the present invention includes a clock synchronization means for synchronizing a data output with a external clock; and a clock tree on/off control means for delaying an enable timing of a RAS idle signal for a predetermined time after a row inactive instruction is supplied, turning on/off a clock tree of the clock synchronization means in response to the RAS idle signal.

15 Claims, 5 Drawing Sheets

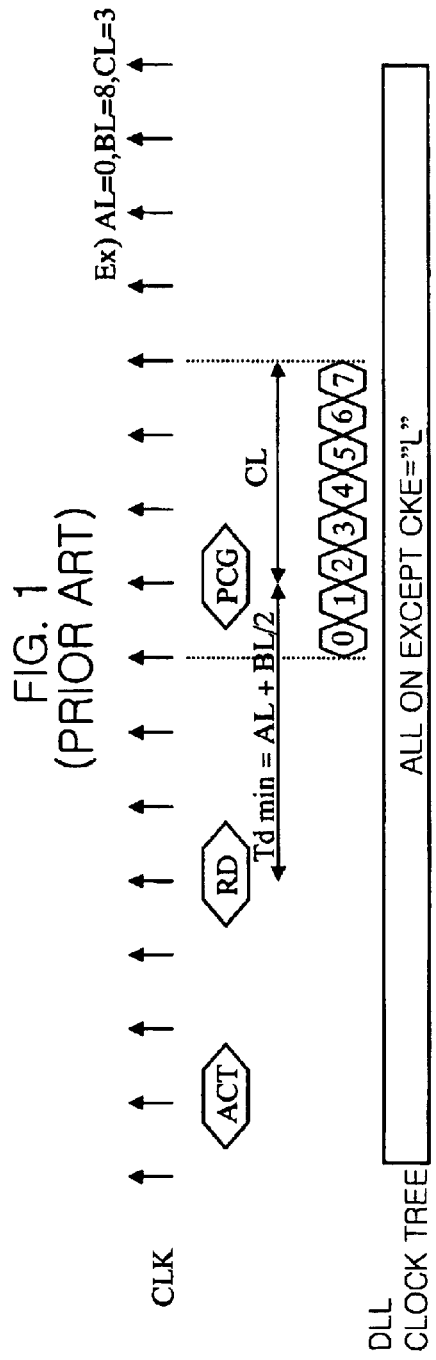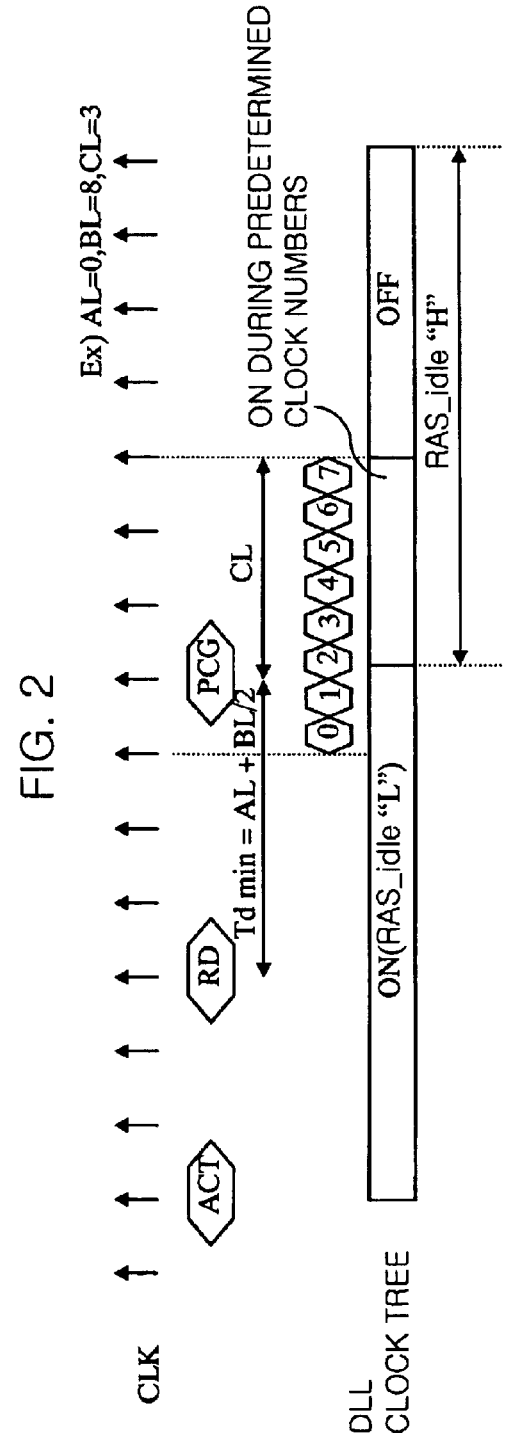

SYNCHRONOUS SEMICONDUCTOR MEMORY DEVICE HAVING CLOCK SYNCHRONIZATION CIRCUIT AND CIRCUIT FOR CONTROLLING ON/OFF OF CLOCK TREE OF THE CLOCK SYNCHRONIZATION CIRCUIT

FIELD OF THE INVENTION

The present invention relates to a design technique of a semiconductor circuit; and, more particularly, to a synchronous semiconductor memory device including a clock synchronization circuit and a clock tree on/off control circuit of the clock synchronization circuit.

DESCRIPTION OF RELATED ART

Generally, in systems or circuits, a clock is a reference signal for synchronizing execution timing and it is also used for more high-speed execution without any error. The clock skew is occurred in an internal circuit when the clock inputted from an external circuit is used in the internal circuit. There are used a phase locked loop (PLL), a delay locked loop (DLL), and so on for compensating the clock skew and thereby equalizing the internal clock with the external clock.

On other hand, the PLL is commonly used in various circuits; however, the DLL is generally used in a double data rate synchronous dynamic random access memory (DDR SDRAM) and a synchronous semiconductor memory device because the DLL has more advantage of noise compared to the PLL.

In a typical semiconductor memory device, e.g., the DRAM, it is issued how to reduce current consumption in proportion with increase of an operating frequency for high-speed execution. Meanwhile, the DRAM is recently used not only in a main memory device of the computer system but also in portable appliances. Therefore, the reduction of current consumption is one of critical request for DRAM design.

A method used in PLL, DLL, and so on is used for outputting data being correspondent to the external clock. Clock synchronous circuits are used in the synchronous semiconductor memory device for a better capability of transmitting data. The clock outputted from the clock synchronous circuit is used in passing the outputted data. If using the clock outputted from the clock synchronous circuit, data-load is not an overburden in a normal execution of the synchronous semiconductor memory device; however, it is critical problem in a stand-by mode. The reason for this result is that an available current is larger in the normal execution than that in the stand-by mode.

Thus, there have been many progressed researches for reducing the current consumption in the stand-by mode of the synchronous semiconductor memory device. In the stand-by mode, the current consumption is changed in response to the operating frequency. The higher the operating frequency is, the more the current consumption is occurred.

FIG. 1 is a timing diagram showing an execution timing of a conventional DDR SDRAM.

As shown, a row activating instruction ACT, a read instruction RD and a row inactivating instruction PCT are supplied for outputting data in the DDR SDRAM. A DLL clock has toggled for sections from a moment of supplying the row activating ACT to a moment of outputting the last data. Thus, a DLL clock tree is turned on in the sections except for a section that the clock enable signal CKE is in logical low 'L'.

In FIG. 1, there is presented case that an additive latency AL is '0', a CAS latency CL is '3', and a burst length is '8'. For reference, the use of the additive latency AL is technique used in DDR II and the AL is an index defining how many clocks are needed for perceiving the instruction in read or write timing like the CAS latency.

Typically, the section that the clock enable signal CKE is in logical low 'L' is called a power-down state, and a section that the clock enable signal CKE is in logical high 'H' is called a non power-down state. The stand-by mode is not only the non power-down state but also a state that the DDR SDRAM does not operate.

However, there is a problem that unnecessary current consumption is occurred in the synchronous memory device because the DLL clock is continuously toggled during the stand-by mode. This problem is also occurred in the synchronous memory device using PLL.

SUMMARY OF THE INVENTION

It is, therefore, an object of the present invention to provide a semiconductor memory device for reducing power consumption by turning off a DLL clock tree in stand-by mode.

In addition, it is an object of the present invention to provide a clock tree on/off control logic using a method for effectively controlling a clock tree of the clock synchronization circuit by using signals related to a row address strobe.

In accordance with an aspect of the present invention, there is provided a synchronous semiconductor memory device includes a clock synchronization means for synchronizing a data output with a external clock; and a clock tree on/off control means for delaying an enable timing of a RAS idle signal for a predetermined time after a row inactive instruction is supplied, turning on/off a clock tree of the clock synchronization means in response to the RAS idle signal.

In accordance with another aspect of the present invention, there is provided a clock tree on/off control means of a clock synchronous circuit for controlling turning the clock tree of the clock synchronous circuit on/off including a first edge triggered pulse generating means for generating a first edge triggered pulse by receiving a RAS idle signal; a clock buffering means for buffering a clock signal having the same period with an external clock in response to the RAS idle signal and a feedback clock tree control signal; a clock period configuration means for deciding a period as same as a clock period of a predetermined output signal of the clock buffering means in response to the RAS idle signal; a second edge triggered pulse generating means for generating a second edge triggered pulse by receiving an output signal of the clock period configuration means; and a latching means for receiving both output signals of the first edged triggered generating means as a set signal and the second edged triggered generating means as a reset signal.

BRIEF DESCRIPTION OF THE DRAWINGS

The above and other objects and features of the present invention will become apparent from the following description of preferred embodiments taken in conjunction with the accompanying drawings, in which:

FIG. 1 is a timing diagram showing an execution timing of a conventional double data rate synchronous dynamic random access memory (DDR SDRAM);

FIG. 2 is a timing diagram showing an execution timing of a DDR SDRAM using a preferred DLL clock tree on/off timing in accordance with the present invention;

DETAILED DESCRIPTION OF THE INVENTION

Figure 3:
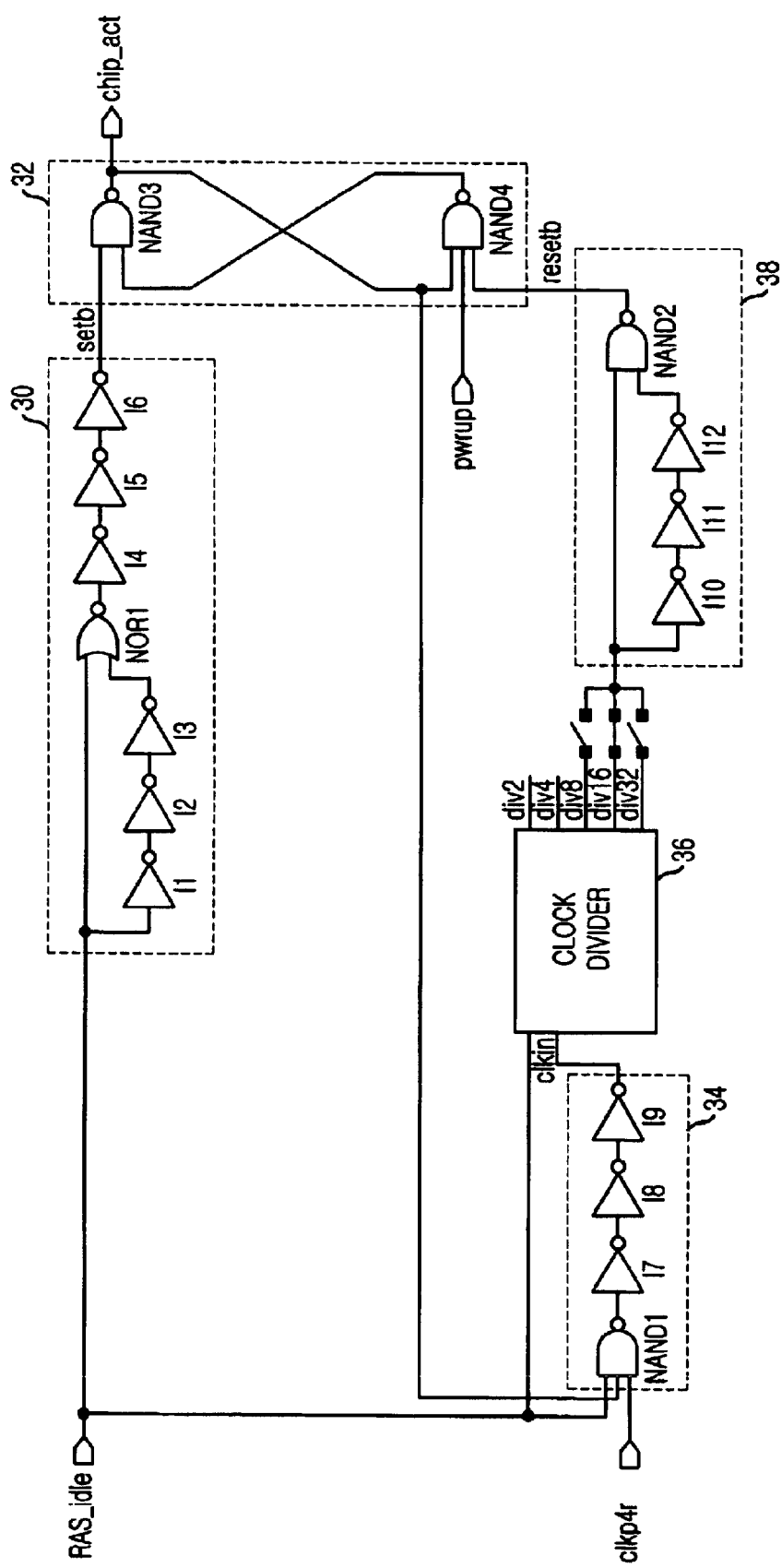
FIG. 3 is a block diagram of a DLL clock tree on/off control circuit in accordance with a preferred embodiment of the present invention.

Hereinafter, a semiconductor memory device according to the present invention will be described in detail referring to the accompanying drawings.

FIG. 2 is a diagram showing execution timing of a double data rate synchronous dynamic random access memory (DDR SDRAM) using a preferred DLL clock tree on/off timing.

When a row activation instruction ACT, a read instruction RD, a row inactivation instruction PCG are sequentially supplied, the DLL clock tree must be turned on until the last data is outputted. The reason for this condition is because a section for a data output is defined in response to an additive latency AL, a CAS latency CL, a bit length BL, and so on. Thus, the DLL clock tree is turned on a moment of from enabling the row activation instruction ACT to a moment of outputting the last data varying in response to variable conditions. For controlling the DLL clock tree, there are needed a RAS idle signal RAS_idle as an internal signal and a control signal defining the last data output. The RAS idle signal RAS_idle defines an interval between the row activation instruction ACT and the row inactivation instruction PCT.

However, it is very difficult to design and implement the semiconductor device having a DLL circuit because it is very complicated to turn the DLL clock tree on/off using combination of two signals like above statement.

Therefore, in the present invention, when the row inactivation instruction PCG is executed after the read instruction RD is inputted, a maximum data output period is calculated so that the clock tree can be turned off without any condition after an elapse of a predetermined number of clock once the PCG is executed.

The condition described in FIG. 2 is AL=0, BL=8, and CL=3. The maximum of a Td, from a moment of activating the row inactivation instruction to a moment of outputting the last datum, depends upon the CL. Also, the minimum of Td is (AL+BL/2). It is assumed that the maximum value of the CAS latency CLmax is '5' in a DDR I memory or a DDR II memory. The DLL clock tree can be turned off after the last datum is outputted if it defines 5 tCK. The tCK is a period of one clock. If the BL is changed from '8' to '4', the last datum is outputted at a 2 tCK advanced timing. Thus, the row inactivation instruction PCG is advanced by the 2 tCK. Otherwise, a time margin is lengthened by the 2tCK. If the timing is 2 tCK ahead, the PCG is activated after an elapse of the maximum 5 tCKs. Herein, the Maximum value 5 tCKs depends upon the value of the CL if BL=8. If the timing is not fastened and the row inactivation instruction RCG is not enabled, the DLL clock tree is turned off at a moment that 2 tCKs are elapsed after the last datum is outputted. Since it is a critical to ensure data stability, there exists no problem as long as the condition of Clmax=5 tCK is satisfied. For instance, according to elements included in the memory, maximum of the CAS latency CLmax is larger than 5 tCK in the DDR I. The above 5 tCK is a criterion of the DDR II. In order to satisfying the condition of 5 tCK, in the preferred embodiment, the semiconductor memory device uses a 1/16 times dividing clock. Namely, the on state of the DLL clock tree is maintained until 8 tCK after the row inactivation instruction PCG is supplied.

FIG. 3 is a block diagram of a DLL clock tree on/off control circuit in accordance with a preferred embodiment of the present invention.

As shown, a clock tree on/off control circuit includes a first edge triggered pulse generator 30 for receiving a RAS idle signal RAS_idle; a clock buffering logic 34 for buffering an internal clock clkp4r delayed in response to the RAS idle signal RAS_idle and a clock tree control signal chip_act which is a final signal; a clock divider 36 for dividing an output signal clkin of the clock buffering logic 34 in response to the RAS idle signal RAS_idle; a second edge triggered pulse generator 38 for receiving an output signal of the clock divider 36; a SR latch logic 32 for receiving a power-up signal pwrup as an initializing signal; an output signal setb of the first edged triggered generator 30 as a set signal; and an output signal resetb of the second edged triggered generator 38 as a reset signal. Herein, a signal div16 is a default.

In the mean time, the first edge triggered pulse generator 30 includes a plurality of inverters I1, I2, and I3 for converting and delaying the RAS idle signal RAS_idle for a predetermined time; a NOR gate NOR1 for receiving the RAS idle signal RAS_idle and an output of the inverter I3; and a plurality of inverters I4, I5, and I6 for buffering an output of the NOR gate NOR1.

The clock buffering logic 34 includes a first NAND gate NAND1 receiving the RAS idle signal RAS_idle, the clock tree control signal chip_act and the internal clock clkp4r, and a plurality of inverters I7, I8, and I9 for buffering an output of the NAND gate NAND1.

In addition, the second edge triggered pulse generator 38 includes a plurality of inverters I10, I11, and I12 for converting and delaying the output signal div16 of the clock divider 36, and a second NAND gate NAND2 receiving an output of the inverter I12 and the clock divider 36.

The SR latch logic 32 includes a 2-input NAND gate NAND3 receiving the output signal setb of the first edge triggered pulse generating logic 30 and a 3-input NAND gate NAND4 receiving the power-up signal pwrup and the output signal resetb of the second edge triggered pulse generating logic 38. Each of an additional input terminals included in each of the NAND gates NAND3 and NAND4 is crossly connected to the output terminals included in each of the NAND gates NAND3 and NAND4.

Figure 4:
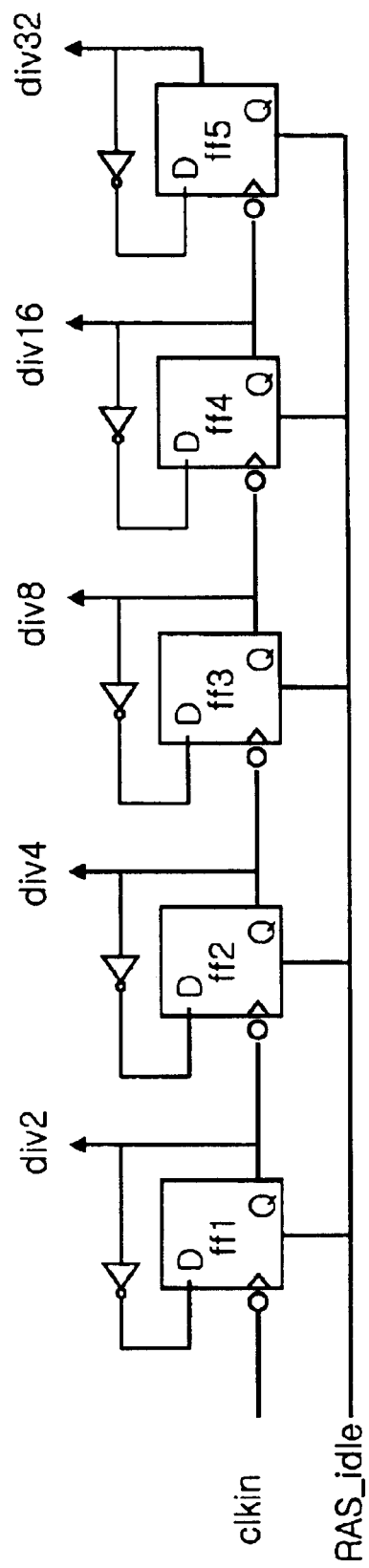
FIG. 4 is a circuit diagram of a clock divider shown in FIG. 3.

FIG. 4 is a circuit diagram showing a structure of the clock divider structure shown in FIG. 3.

As shown, the clock divider 36 includes a first to a fifth flip-flops ff1, ff2, ff3, ff4 and ff5. The first flip-flop receives the RAS idle signal RAS_idle at a reset terminal and the output signal clkin of the clock buffering logic 34 at a clock terminal. Output of the first flip-flop is inputted at a data input terminal after inverted by an inverter. The second flip-flop receives the RAS idle signal RAS_idle at a reset terminal and the output signal Q of the first flip-flop ff1 at a clock terminal. Output of the second flip-flop is inputted at a data input terminal after inverted by an inverter. Thus, the first to the fifth flip-flops ff1, ff2, ff3, ff4 and ff5 can individually output a div2, a div4, a div8, a div16, and a div32. The div2 means a signal which divides the output signal clkin into two times.

Figure 5:
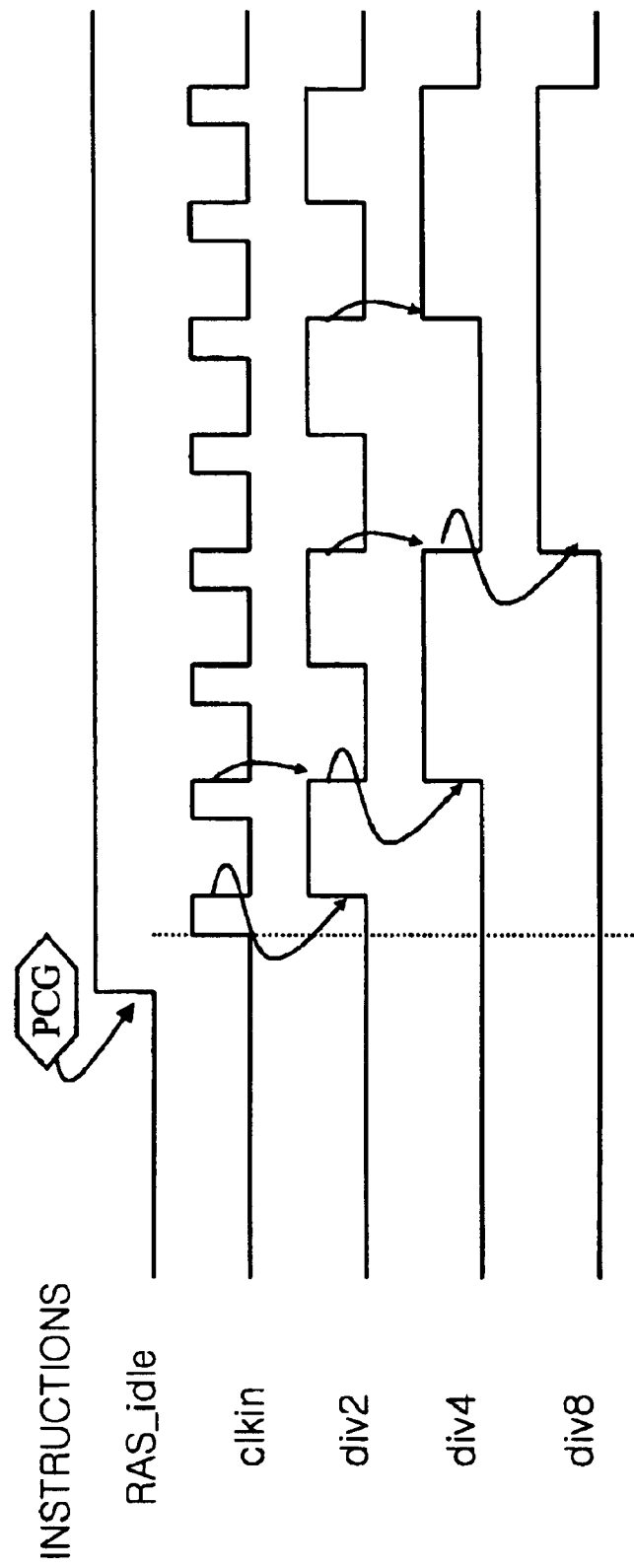
FIG. 5 shows a timing diagram of the clock divider shown in FIG. 4.

FIG. 5 shows a timing diagram of the clock divider shown in FIG. 4. Hereinafter, there is described execution of the clock divider 36.

First, the row inactivation instruction PCG enables the RAS idle signal RAS_idle so that the output signal clkin of the clock buffering logic 34 is toggled. If output signals of all flip-flops are initialized by the RAS idle signal RAS_idle, the first flip-flop ff1 receives a falling edge of the output signal clkin of the clock buffering logic 34 and generates an output signal as logical high at the data output terminal Q. After one clock period 1 tCK, the first flip-flop ff1 receives a next falling edge of the clock buffering logic 34 and outputs the inverted output signal which is inverted by the inverter. Namely, the first flip-flop outputs the signal div2 obtained by dividing the clock clkin by half ½.

Moreover, an output period continuously increases by two times because each of the second to the fifth flip-flops ff2 to ff5 receives the output of the prior flip-flop.

Figure 6:
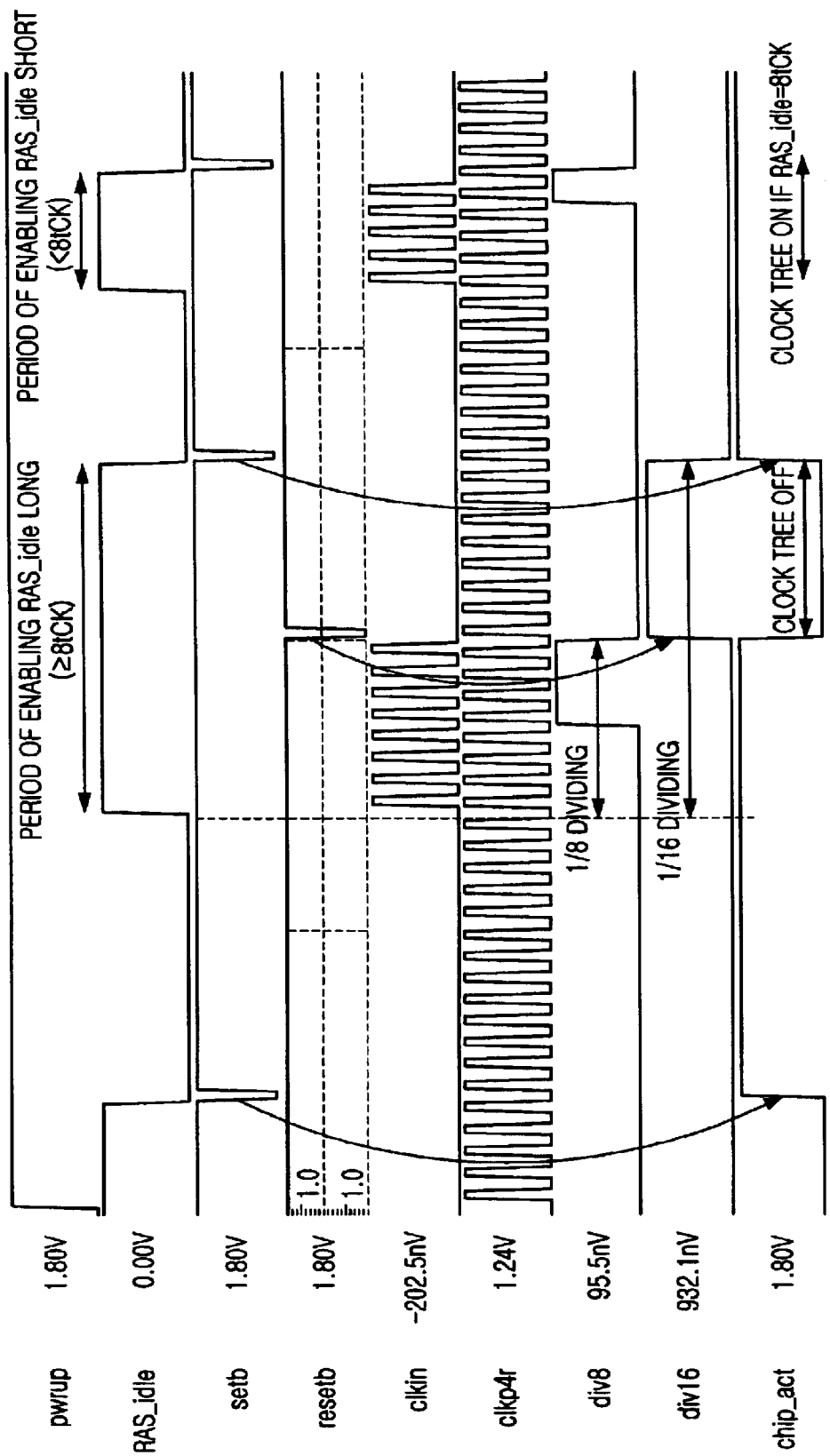
FIG. 6 shows a timing diagram of the DLL clock tree on/off control means shown in FIG. 3.

FIG. 6 shows a timing diagram of the DLL clock tree on/off control means shown in FIG. 3.

As shown, the SR latch logic 32 is initialized by changing the power-up signal pwrup from a logical low to a logical high so that the clock tree control signal chip_act is assigned to the logical low.

Next, if the RAS idle signal is changed from the logical high to the logical low by the row activation instruction ACT, the first edge triggered pulse generator 30 outputs the setb transited to the logical low at the falling edge of the RAS idle signal RAS_idle. According to the setb, the SR latch logic 32 is set so that the clock tree control signal is enabled at the logical high.

Then, if the read instruction is inputted, the datum is outputted in response to the CAS latency CL.

Continuously, if the row activation instruction PCG is supplied, the RAS idle signal RAS_idle is enabled at the logical high. Then, the delayed internal clock clkp4r is inputted to the clock buffering logic 34 so that the output clkin of the clock buffering logic 34 is toggled.

Meanwhile, the clock divider 36 generates a divided clock in accordance with a predetermined divide ratio, e.g., default ¹⁄₁₆, after receiving the output clkin of the clock buffering logic 34. The ¹⁄₁₆ divided clock div16 is a signal of which period is 16 tCKs. The 8 tCKs of the period of the div16 is in logical high and the other 8 tCKs is in a logical low. The second edge triggered pulse generator 38 outputs the short pulse resetb pulsing to low at the rising edge of the ¹⁄₁₆ divided clock div16. Thus, the SR latch logic 32 is reset, the DLL clock tree is turned off by disabling the clock tree control signal chip_act at the logical low. For instance, if the clock tree control signal chip_act is used as an enabling signal of a DDL clock driver, the DLL clock driver is disabled when the clock tree control signal chip_act is disabled as logical low. Then, the DDL clock is not toggled.

Afterwards, if the RAS idle signal RAS_idle is disabled at the logical low, the clock tree control signal chip_act is in the logical high and the DLL clock tree turns on.

Although a section for turning off the DLL clock tree is defined in a long RAS idle section, e.g., RAS_idle≧8 tCK, the section for turning off the DLL clock tree is not defined in a short RAS idle section, e.g., RAS_idle<8 tCK.

According to the present embodiment, even though the RAS idle signal RAS_idle is enabled at the logical high in response to the row inactivation instruction PCG, it is stable to output the last datum for a section ensured by the clock divider 36. Because time margin is changed in response to the AL, the CL, and the BL, the dividing ratio of the clock divider 36 can be prearranged in response to each of the AL, the CL, and the BL. The time margin means how many tCK is needed for turning on the DLL clock tree after enabling the RAS idle signal RAS_idle at the logical high.

For example, the preferred embodiment describes the clock divider used for ensuring the margin until the last datum is outputted after the RAS idle signal RAS_idle is enabled at the logical high. However, the present invention is applicable in the case that the section of turning the DLL clock tree off is defined to 1, 2, 3, 4, 5, . . . tCK by using either a flip-flop or a counter.

In addition, there is described the preferred embodiment of the present invention controlling the DLL clock tree on/off. However, the present invention can still be applied to another case of controlling the PLL clock tree on/off.

While the present invention has been descried with respect to the particular embodiments, it will be apparent to those skilled in the art that various changes and modification may be made without departing from the spirit and scope of the invention as defined in the following claims.

What is claimed is:

1. A synchronous semiconductor memory device, comprising:
    a clock synchronization means for synchronizing a data output with an external clock; and
    a clock tree on/off control means for delaying an enable timing of a RAS idle signal for a predetermined time after a row inactive instruction is supplied to selectively turning on/off a clock tree of the clock synchronization means in response to the RAS idle signal.

2. The synchronous semiconductor memory device as recited in claim 1, wherein the clock synchronization means includes a delay locked loop.

3. The synchronous semiconductor memory device as recited in claim 1, wherein the clock synchronization means includes a phase locked loop.

4. The synchronous semiconductor memory device as recited in claim 1, wherein a clock tree on/off control means includes:
    a first edge triggered pulse generating means for generating a first edge triggered pulse by receiving a RAS idle signal;
    a clock buffering means for buffering a clock signal having the same period with the external clock in response to the RAS idle signal and a feedback clock tree control signal;
    a clock period configuration means for deciding a period as same as a clock period of a predetermined output signal from the clock buffering means in response to the RAS idle signal;
    a second edge triggered pulse generating means for generating a second edge triggered pulse by receiving an output signal of the clock period configuration means; and
    a latching means for receiving both output signals of the first edged triggered generating means as a set signal and the second edged triggered generating means as a reset signal.

5. The synchronous semiconductor memory device as recited in claim 4, wherein the clock period configuration means includes a clock divider.

6. The synchronous semiconductor memory device of claim 4, wherein the clock period configuration means includes multi-cascaded flip-flops.

7. The synchronous semiconductor memory device of claim 4, wherein the clock period configuration means includes a counter.

8. The synchronous semiconductor memory device of claim 5, wherein the clock divider includes:
   a plurality of flip-flops having a reset terminal for receiving the RAS idle signal and a clock terminal for receiving an inverse signal of itself output; and
   a plurality of inverters connected between a output terminal and a input terminal of each inverter for delivering a converted output signal to the input terminal,
   wherein each flip-flops is cascade-connected to each other by receiving the output of a prior flip-flop at a clock terminal.

9. The synchronous semiconductor memory device of claim 4, the first edge triggered pulse generating means generates the first edge triggered pulse by triggering rising or falling edges of the RAS idle signal.

10. The synchronous semiconductor memory device of claim 4, wherein the clock buffering means includes:
    a NAND gate receiving the RAS idle signal, the feedback clock tree control signal, and a clock signal being same to the external clock; and
    a plurality of inverters for buffering an output of the NAND gate.

11. The synchronous semiconductor memory device of claim 4, wherein the latching means is initialized by a power-up signal.

12. The synchronous semiconductor memory device of claim 11, wherein the latching means includes a cross-coupled NAND latch.

13. The synchronous semiconductor memory device of claim 12, wherein the cross coupled NAND latch includes:
    a first NAND gate receiving an output of the first edge triggered pulse generating means and an output of a second NAND gate; and
    the second NAND gate receiving the power-up signal, an output of the second edge triggered pulse generating means and an output of the first NAND gate.

14. The synchronous semiconductor memory device of claim 4, wherein the clock synchronization means includes a delay locked loop.

15. The synchronous semiconductor memory device of claim 4, wherein the clock synchronization means includes a phase locked loop.

* * * * *